(12) United States Patent
Weindl et al.

(10) Patent No.: US 9,880,212 B2
(45) Date of Patent: Jan. 30, 2018

(54) METHOD AND APPARATUS FOR SPATIALLY RESOLVED DIAGNOSIS

(71) Applicant: Friedrich-Alexander-Universitaet Erlangen Nuernberg, Erlangen (DE)

(72) Inventors: Christian Weindl, Zirndorf (DE); Erik Fischer, Nuremberg (DE)

(73) Assignee: Friedrich-Alexander-Universitaet Erlangen Nuernberg, Erlangen (DE)

(*) Notice: Subject to any disclaimer, the term of this patent is extended or adjusted under 35 U.S.C. 154(b) by 118 days.

(21) Appl. No.: 14/683,390

(22) Filed: Apr. 10, 2015

(65) Prior Publication Data
US 2015/0316599 A1   Nov. 5, 2015

(30) Foreign Application Priority Data
Apr. 11, 2014  (DE) .................. 10 2014 005 698

(51) Int. Cl.
*G01R 31/00* (2006.01)
*G01R 31/02* (2006.01)
(Continued)

(52) U.S. Cl.
CPC ......... *G01R 31/001* (2013.01); *G01R 31/021* (2013.01); *G01R 31/083* (2013.01); *G01R 31/11* (2013.01)

(58) Field of Classification Search
CPC ... G01R 31/001; G01R 31/021; G01R 31/083
(Continued)

(56) References Cited

U.S. PATENT DOCUMENTS

| 4,538,103 A | 8/1985 | Cappon |
| 4,970,467 A | 11/1990 | Burnett |

(Continued)

FOREIGN PATENT DOCUMENTS

| DE | 69025428 | 6/1996 |
| DE | 19546455 | 5/1997 |

(Continued)

OTHER PUBLICATIONS

European Search Report, dated Aug. 31, 2015.
(Continued)

*Primary Examiner* — Jermele M Hollington
*Assistant Examiner* — Christopher McAndrew
(74) *Attorney, Agent, or Firm* — Greer, Burns & Crain, Ltd.

(57) ABSTRACT

A method and device for diagnosing an electrical condition of a spatially extended hardware component in a spatially resolved manner via interference between pulses fed into the component by a signal generator. The method includes: feeding at least two pulses into the component offset by a pulse interval; detecting the interfered pulses and echoes via an analysis unit; varying the pulse interval for the spatially resolved scanning of the hardware component along its length; repeating the steps until the component has been scanned at least in some sections; and analyzing the detected interfered pulses in the analysis unit. The device includes at least one signal generator connected to the component and to an analysis unit to generate the pulses, wherein local energy losses are mathematically determined over the length of the component on the basis of a plurality of interference voltage waveforms and voltage waveforms induced by the pulses.

19 Claims, 12 Drawing Sheets

(51) Int. Cl.
*G01R 31/11* (2006.01)
*G01R 31/08* (2006.01)

(58) Field of Classification Search
USPC .......................................... 324/543
See application file for complete search history.

(56) References Cited

U.S. PATENT DOCUMENTS

| | | | | |
|---|---|---|---|---|
| 5,184,081 A * | 2/1993 | Oswald | ............... | G01R 31/083 324/532 |
| 5,270,661 A | 12/1993 | Burnett | | |
| 5,361,776 A * | 11/1994 | Samuelson | .......... | A61B 5/0535 600/547 |
| 6,982,557 B1 * | 1/2006 | Lo | ........................ | G01R 31/083 324/539 |
| 6,995,551 B1 * | 2/2006 | Lo | ........................ | G01R 31/083 324/533 |
| 7,019,533 B1 * | 3/2006 | Lo | ........................ | G01R 31/11 324/533 |
| 7,164,274 B2 * | 1/2007 | Pharn | .................... | G01R 31/11 324/533 |
| 7,808,247 B1 * | 10/2010 | Lo | ........................ | G01R 31/021 324/533 |
| 7,966,137 B2 | 6/2011 | Fantoni | | |
| 7,986,147 B1 * | 7/2011 | Lo | ........................ | G01R 31/021 324/533 |
| 9,103,869 B2 * | 8/2015 | Breed | .................... | G01R 31/11 |
| 2002/0130668 A1 * | 9/2002 | Blades | .................... | G01R 1/07 324/536 |
| 2002/0171431 A1 * | 11/2002 | Lee | .................... | G01N 27/4167 324/438 |
| 2006/0038573 A1 * | 2/2006 | Sarkozi | ............. | G01R 31/1272 324/536 |
| 2006/0097730 A1 | 5/2006 | Park et al. | | |
| 2008/0048668 A1 | 2/2008 | Mashikian | | |
| 2010/0164505 A1 * | 7/2010 | Breed | .................. | G01R 31/021 324/533 |
| 2013/0204555 A1 | 8/2013 | Scheuschner et al. | | |
| 2013/0271151 A1 * | 10/2013 | Breed | .................... | G01R 31/11 324/533 |
| 2014/0002098 A1 * | 1/2014 | Sales Casals | .......... | G01R 31/08 324/521 |

FOREIGN PATENT DOCUMENTS

| | | |
|---|---|---|
| DE | 102010013103 | 9/2011 |
| EP | 2623999 | 8/2013 |
| JP | 2001153913 | 6/2001 |

OTHER PUBLICATIONS

"Network Cable Fault Location Based on the Wide Pulse Time Domain Reflection", Ke Liu et al., Apr. 28, 2009.
German Priority Doc Report, dated Apr. 11, 2014.

* cited by examiner

METHOD AND APPARATUS FOR SPATIALLY RESOLVED DIAGNOSIS

CROSS-REFERENCES TO RELATED APPLICATIONS

This application claims the benefit of the German patent application No. 10 2014 005 698.8 filed on Apr. 11, 2014, the entire disclosures of which are incorporated herein by way of reference.

BACKGROUND OF THE INVENTION

The invention primarily relates to a method for diagnosing the electrical condition of a spatially extended hardware component, in particular of a cable for transmitting electrical energy, in a spatially resolved manner by means of interference between pulses fed in into the component by a signal generator.

In addition, the invention comprises a device for diagnosing an electrical condition of a spatially extended hardware component, in particular of a cable for transmitting electrical energy, in a spatially resolved manner by means of interference between at least two pulses temporally offset by a pulse interval $\Delta t$ that are fed into the component.

The current state of the art in the field of diagnosis of the condition of power supply cables is based upon conventional methods, for example, the measurement of partial discharges and determination of the loss factor (or tan ($\delta$) measurement).

In addition, other methods are known, such as the relaxation current measurement method and the return voltage measurement method. In these measurement methods, the cable to be examined is first polarized with a DC voltage. Subsequently the depolarization current or return voltage following a short circuit is determined. These measurement variables, as in the case of loss factor determination, allow the condition of the dielectric to be assessed, for example, the moisture level, or the insulation resistance, etc. This is an integral measurement technique, however, one which does not allow a spatially resolved diagnosis of the cable condition. Furthermore, these methods are very sensitive and susceptible to interference from external environmental effects, such as humidity and temperature, with the result that they have not so far been widely used in the energy supply field.

In the partial discharge diagnosis (so-called "TE" diagnosis (=partial discharge diagnosis)) mentioned above, partial discharge defects are detected, assessed and localized. However, no sufficiently reliable conclusions can be drawn as to the cable condition and/or its remaining service life on the basis of a partial discharge diagnosis alone. This is only possible by using it in combination with other methods, for example the loss factor measurement mentioned above. A further requirement is that the voltage loading during the measurement be greater than the rated voltage, in order to obtain any reliable predictions as to the condition of the cable. On account of the high voltage loading, however, additional ageing and/or damage to the cable to be diagnosed can be caused. Spatial localization of a primary discharge site is possible, but the presence of multiple defects, long cable lengths with correspondingly high damping levels or moisture in the cable severely hampers any localization.

DE 10 2010 013 103 A1 discloses an apparatus and a method for the diagnosis of measurement objects using a measurement voltage, wherein the measurement method is essentially based upon determination of the loss factor.

The measurement takes place by applying a high voltage to the cable. Subsequently, measurement voltages are measured by means of a voltage detection arrangement and currents that are assigned to individual measurement objects are measured by means of the at least two current detection devices and analyzed in an analysis unit.

The high voltage required for the measurement can be generated by a large transformer, for example, but this is complicated and expensive. Alternatively the measurement high voltage can be produced by a resonance system or a so-called "VLF" method (=Very Low Frequency method), neither of which operate at the typical mains frequency of 50 Hz, however. Furthermore, these are examples of an integral measurement method, i.e., spatial resolution is impossible and consequently only the overall condition of a cable can be assessed.

JP 2001,153913 (A) further discloses a diagnosis method for the spatially resolved detection of a deterioration and/or degeneration in the electrical characteristics of a cable.

In this case, the frequency range reflectometry ("FDR method"=Frequency domain Reflectometry method) is used, which to an extent can also be applied for condition diagnosis. An advantage of this measurement method is that it can be carried out both non-destructively and with almost zero load, and consequently only requires comparatively low equipment complexity.

According to the method a resonant frequency analysis—or frequency spectral analysis is carried out, wherein the input signal is usually a frequency sweep. Impedance changes along a cable can therefore be determined in a similar manner to time domain reflectometry ("TDR").

It is true that only gross changes in the electrical characteristics of the cable are detectable, which means that the electrical condition of the cable and/or the dielectric cannot be assessed with sufficient confidence. In some circumstances pre-polarization of the test sample with a high DC voltage allows defects to be more clearly exposed, allowing them to then be detected by carrying out a subsequent TDR measurement or FDR measurement.

In addition, U.S. Pat. No. 7,966,137 B2 discloses an analysis method or system based on resonance measurements on conductors (conductor resonance analysis).

This method is essentially an FDR measurement method with a resonance frequency analysis. This frequency spectral analysis delivers little in the way of reliable information about the condition of the cable, however, unless there are (reference) measurements available from an identical, intact cable.

US 2006/0097730 A1 further discloses an apparatus and a method for carrying out TDR reflection measurements.

In this case the JTFDR measurement method (JTFDR="Joint Time Frequency Domain Reflectometry") is applied, which represents a combination of the TDR and FDR measurement methods. In this method a matched input signal in the form of a frequency sweep with a Gaussian pulse as an envelope is fed into the cable to be examined and the characteristics of both methods are combined.

A disadvantage of this previously known method can be seen in the fact that, again, only changes in the impedance or the frequency spectrum respectively can be detected and analyzed.

US 2008/0048668 A1 furthermore discloses diagnosis methods for electrical cables using an axial tomography procedure.

In this arrangement the cable to be examined is connected in circuit at its beginning and end in a suitable manner, which can be effected for example by a variable voltage, an internal resistance, a variable frequency, a load impedance or the like, so that a standing wave is generated. By means of the voltage and current distributions and by measuring the apparent power at the input and output of the cable, balance equations can be set up, which by N-fold variation of the input parameters yield an equation system, with which all possible conductor parameters can be theoretically defined at any arbitrary point of the cable.

This method however implies a vast amount of measurement effort at both ends of the cable under test, because a large number of measurements with very many different input parameters must be carried out in order to obtain a result.

SUMMARY OF THE INVENTION

It is an object of the invention therefore to specify a method for the spatially resolved electrical diagnosis of a spatially extended hardware component, in particular, a high voltage cable for power transmission. A further object of the invention is to specify a device for carrying out the method which is mobile while at the same time easy to handle.

This object is firstly achieved by a method having the following steps:

feeding in of at least two pulses into the component which are offset by a pulse interval $\Delta t$, detection of the interfered pulses and echoes by means of an analysis unit, variation of the pulse interval $\Delta t$ for the spatially resolved scanning of the hardware component along its length l, repetition of the steps a) to c) until the component has been scanned at least in some sections, and analysis of the detected interfered pulses in the analysis unit.

This method facilitates a precise, spatially resolved diagnosis of the electrical condition of a hardware component which is spatially extended primarily in its longitudinal direction, in particular of an energy supply cable, including any coupling elements, for example cable couplers. The method enables sufficiently robust conclusions to be drawn about local qualitative characteristics, so that given additional expert knowledge, the probability of failure of precisely defined cable segments or cable sections can be predicted. Based on the comparatively low measurement effort involved, the method can also be used for making cable measurements in the field, i.e., on site. The shape of the pulses can in principle have any temporal profile.

In an advantageous configuration, to provide a spatially resolved diagnosis in method step e), local energy losses eW(x) are mathematically determined along the length l of the cable on the basis of a plurality of interference voltage waveforms produced by the pulses and voltage waveforms, wherein the voltage waveforms are digitalized by means of the analysis unit and mathematically correlated with an error-free model of the component.

This allows reliable, spatially resolved information to be obtained about the electrical condition of the component. In addition, interference-free voltage waveforms can be correlated with the interference voltage waveforms in order to optimize the analysis. As a result of the digital analysis unit, detection and mathematical analysis of the voltage waveforms received by the analogue-digital converter is possible in real time.

In a further advantageous configuration of the method, two pulses each of the same or opposite polarity interfere with each other constructively or destructively.

In the context of the measurement method according to the invention, this allows both the constructive interference between the pulse pairs fed into the cable and/or their destructive interference to be exploited.

According to an advantageous further development, pulses and pulse sequences with a maximum amplitude of up to 1,000 volts are generated.

This enables safe testing of the hardware component without the risk of exacerbating any previously existing dielectric damage. The pulses applied can have, for example a rectangular, trapezoidal, triangular, sawtooth-shaped, sinusoidal, sin(x)/x-shaped, exponential, semicircular, semi-elliptical, windowed rectangular, bell-shaped (Gaussian) pulse shape, or any combination of at least two of the given pulse shapes. The windowed rectangular pulses can be formed, for example, using "Hamming", "Blackmann", "Harris", "Kaiser" or "von Hann" window types.

Suitable choice of the pulse shape (e.g., Gaussian pulse, etc.) of the pulses fed into the component allows the diagnostic capabilities of the measurement method according to the invention to be optimized. In addition, by suitable choice of the pulse shape, a dispersion correction can be applied. For this purpose pulses can be generated, for example, which are rectangular in one section of the extended component or cable of interest, in particular that to be examined, but at the beginning are not.

According to a further advantageous configuration, the length l of the component is detected by the digital analysis unit and the signal generator, in particular by measuring a transit time of at least one pulse.

This enables a simple means of determining the length l of the component to be diagnosed. The knowledge of the exact length l is necessary, among other reasons, to control the pulse interval $\Delta t$ of the pulses fed into the cable such that these interfere with each other at a position x to be examined, or that interference occurs in general. By successive variation of the pulse interval $\Delta t$ of the pulse pairs fed into the cable, the cable can be accurately scanned and electrically evaluated over its total length l. Alternatively, the overall length of the hardware component can also be determined by means of well-known TDR methods, FDR methods or a combination hereof.

In a further advantageous extension of the method it is provided that the spatially resolved diagnosis of the electrical condition of the cable is carried out either fully automatically, preferably under control of the digital analysis unit, or manually.

This enables a problem-free application of the measurement method for cable diagnosis according to the invention, which is substantially free of measurement errors. A manual flow control of the method is also possible, either as an addition or alternative.

Due to the fact that at least one signal generator is connected to the component and to an analysis unit to generate the pulses, wherein to provide a spatially resolved diagnosis, local energy losses eW(x) can be mathematically determined along the length l of the component on the basis of a plurality of interference voltage waveforms and voltage waveforms produced by the pulses, it is possible to obtain an exact, spatially resolved diagnosis of the electrical condition of an extended hardware component, in particular of its dielectric, over its total length l with a comparatively little measurement effort. This allows reliable conclusions to be drawn as to the electrical condition of individual sections of the hardware component, extended primarily in its longitudinal direction, including any connecting elements which may be present, for example cable couplers or the like.

Suitable choice of the pulse shape (e.g., Gaussian pulse) of the pulses generated by the signal generator and fed into the component allows the diagnostic capabilities of the measurement method according to the invention to be considerably enhanced. The shape of the pulses used here can have any temporal waveform and be formed, for example, in a rectangular, trapezoidal, triangular, sinusoidal, bell-shaped (Gaussian) manner or by a superposition of geometries of these types. Additionally or alternatively, the pulses can also be formed by the composition of different geometries section by section. The pulses can be asymmetrical, for example, in relation to their center (tW/2). The pulse shape, moreover, enables the dispersion correction to be made. For this purpose, the signal generator generates pulses which are rectangular in one section of the extended component or cable of interest, in particular the section to be examined, but which have a waveform shape deviating from this at the beginning of the cable. This applies only in a restricted manner, because the superimposed pulses have different transit times.

According to an advantageous configuration, the voltage waveforms are can be digitalized by the analysis unit and mathematically correlated with an error-free model of the component.

This means that defective sections of the component can be reliably detected and as a rule, detected in good time before a total electrical failure occurs.

In an advantageous extension, a filter system and a variable impedance are connected downstream of the signal generator, the variable impedance being connected to a beginning of the component.

This provides an optimal coupling to the component or power cable in terms of measurement-related properties.

In accordance with one configuration, the analysis unit is assigned a measurement device, in particular an analogue-digital converter, and at least one digital calculation unit.

These enable the voltage waveforms and their echoes to be detected and analyzed with high accuracy in real time. At least one display screen is preferably provided as an optical output unit. In addition, the analysis unit can also comprise a printer. The analysis unit can furthermore also be assigned an acoustic signal device, for example, a loudspeaker, for outputting signal tones and/or chirp tones for specific operating conditions or error messages, and/or speech output.

According to one advantageous configuration of the apparatus, one end of the component is open or terminated with an impedance Z.

This allows the interference of the pulses fed into the component to be controlled.

It is further provided that the error-free model of the hardware component can be coupled to the signal generator and the analysis unit.

This enables reference measurements and analyses to be carried out with an identical, but provably intact component or cable, wherein the model is preferably realized by means of a digital simulation within the analysis unit.

In a further advantageous extension, pulses with the same polarity or pulses with opposite polarity can be generated using the signal generator.

The pulses fed into the component can therefore interact with each other by constructive or destructive interference.

In accordance with an advantageous configuration, a length l of the component can be identified by means of the analysis unit and the signal generator, in particular by means of a transit time measurement with at least one pulse.

This enables a particularly simple means of detection of the total length l of the cable or hardware component to be diagnosed.

DETAILED DESCRIPTION OF THE PREFERRED EMBODIMENTS

Figure 1:
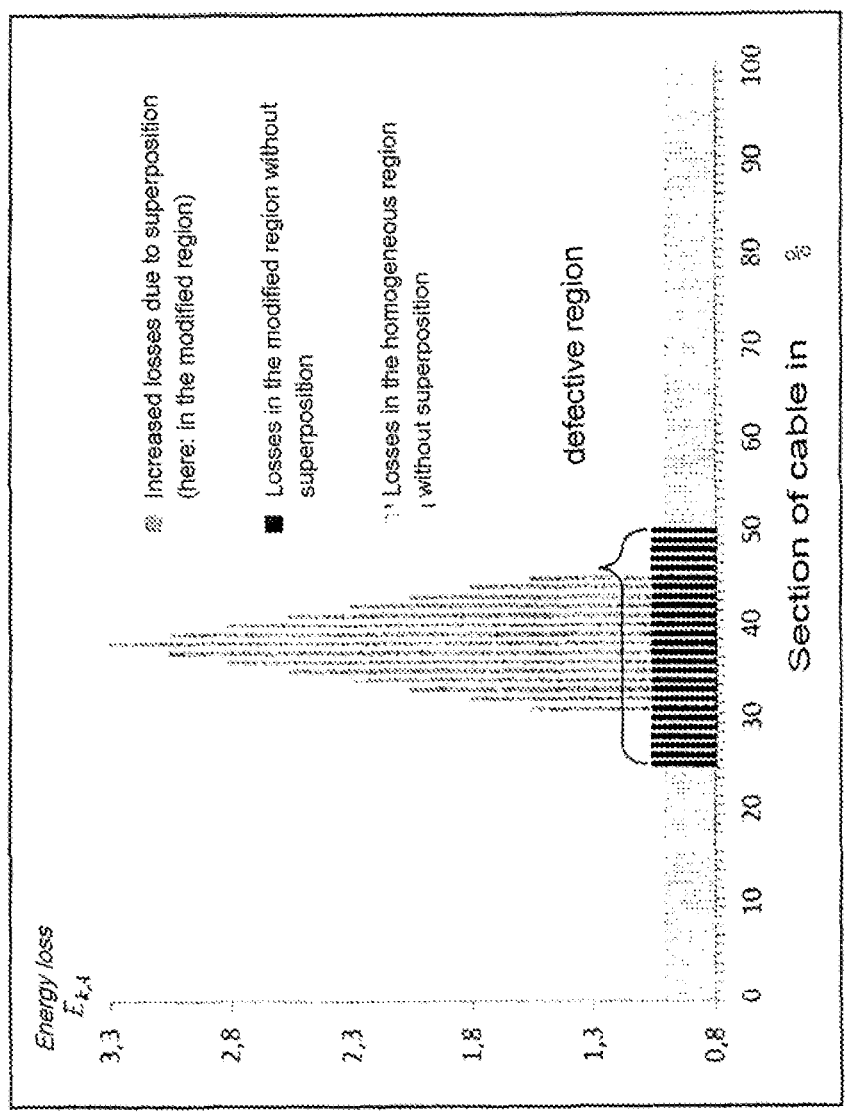
FIG. 1 Energy loss due to interference of the pulse pairs in an altered region of a component extended primarily in its longitudinal direction, FIG. 2 Energy loss due to interference of the pulse pairs in a homogeneous (intact) region of the component, FIG. 3 Energy losses in the absence of interference of the pulse pairs in the component, FIG. 4 Voltage waveform due to constructive interference of the pulse pairs, FIG. 5 Current waveform due to constructive interference of the pulse pairs, FIG. 6 Voltage waveform due to destructive interference of the pulse pairs, FIG. 7 Current waveform due to destructive interference of the pulse pairs, FIG. 8 Dielectric energy losses due to constructive and destructive interference of the cable with a defective region at approximately 30% of a (total) length l of the component, FIG. 9 electrical block circuit diagram of an embodiment of an apparatus according to the invention for implementing the method, FIG. 10 a voltage waveform UA (t) at a beginning of the component, FIG. 11 the voltage waveform UA (t) at the beginning of the component without reflections, and FIG. 12 the voltage waveform UA (t) at the beginning of the component with reflections.

Before proceeding, the theoretical bases of the method according to the invention will first be briefly explained. The method exploits the interference properties of electrical travelling waves in order to facilitate a spatially resolved diagnosis of a component spatially extended primarily in its longitudinal direction, in particular a power transmission cable, and to describe the characteristics of the dielectric with high accuracy in a qualitative manner.

The term "component spatially extended in its longitudinal direction" is to be understood in the context of this description as primarily meaning single or multi-cored power supply cables of all voltage levels, including any necessary coupling and connection elements, for example, cable couplers or the like.

In the course of the method according to the invention, a plurality of pulse pairs forming travelling waves is fed into the component or cable under test. The pulses inducing the travelling waves propagate in the component under test with a finite velocity v and are attenuated and distorted by conductor-dependent losses.

This behavior is treated with the complex propagation constant γ. It is composed of a real component α and an imaginary component β. The real part α of the propagation constant is designated as the damping constant and the imaginary part β as the phase constant.

$$\gamma = \alpha + j\beta = \sqrt{(R' + j\omega L') \cdot (G' + j\omega C')} \qquad (1)$$

If one assumes a simplification for travelling waves which is permissible here, the dispersion velocity or propagation velocity is calculated from the inductance and capacitance per unit length of the medium as follows:

$$v = \frac{\partial x}{\partial t} = \frac{1}{\sqrt{L'C'}} \tag{2}$$

If attenuation and dispersion occur in the cable, then we further distinguish a group velocity and phase velocity, in both of which a resistance and conductance per unit length must be considered. A travelling wave consists in this case of a time-discrete signal, which is interpreted as a pulse with a defined amplitude, pulse width tW and pulse shape. These parameters are variable and dependent on the cable to be diagnosed. The quantity to be measured is the voltage or current waveform at the input or output of the cable. This procedure at first resembles Time Domain Reflectometry (TDR).

In contrast to this, in the method according to the invention it is not a single pulse or step which is produced, but always a pulse pair with a defined pulse interval Δt. These pulses are fed in from either one or both ends. In both cases, the pulse pairs are designed to meet at a specific position x, which is determined by the pulse interval defined earlier, in the propagation medium. The following is true: 0≤x≤l, where l is the total length of the component under test. Considering first the single-ended feed, this can be obtained by a pulse pair being fed in at the beginning of the conductor and the conductor end being "open". This results therefore in a reflection of the travelling waves or the pulse pair at the end—wherein the reflection factor of the voltage at the open cable end is unity—and a reverse travelling wave is obtained. The reverse travelling wave, or the first pulse, and the second following wave or second pulse, meet each other in the component or cable at point x, which is dependent on the pulse interval and the propagation velocity. A further variant is the termination of the cable with a variable impedance Zk+1, due to which other reflection factors are produced.

$$r_k = \frac{Z_{k+1} - Z_k}{Z_{k+1} + Z_k} \tag{3}$$

At the end of the component, if Zk+1→∞, the following applies:

$$r_k = \lim_{Z_{k+1} \to \infty} -\frac{Z_{k+1} - Z_k}{Z_{k+1} + Z_k} = \tag{4}$$

At the point at which the pulses meet or are superimposed, interference occurs, producing locally increased or reduced electrical losses there in comparison to the remaining sections within the dielectric of the component under test. This means that an actual spatial resolution becomes possible in the course of the method according to the invention. The characteristic impedance of the component in this case is obtained as follows:

$$Z = \sqrt{\frac{R' + j\omega L'}{G' + j\omega C'}} = \frac{u_k(x,t)}{i_k(x,t)} = \frac{u_r(x,t)}{i_r(x,t)} \tag{5}$$

Simplified formula for the characteristic impedance according to wave theory with real values:

$$Z_w = \sqrt{\frac{L'}{C'}} \tag{6}$$

In addition, the general formula for the energy loss applies:

$$E_V = \int_{t_0}^{t_2} u(t) \cdot t(t) dt = \int_{t_0}^{t_2} P_V(t) dt \tag{7}$$

The power loss in a discrete element (section) of the component to be examined observes the relation:

$$P_v = \frac{U^2}{\frac{R^1}{Z_w^2} + C'} \tag{8}$$

Thus markedly increased electrical losses are obtained at the interference point x, that are a maximum immediately at the point of impact and decrease towards the edge. If one neglects the attenuation on the conductor, in accordance with equation (7) a distribution of the losses in the form of a triangle is obtained, as is also illustrated in FIG. 3 and FIG. 4.

Figure 2:
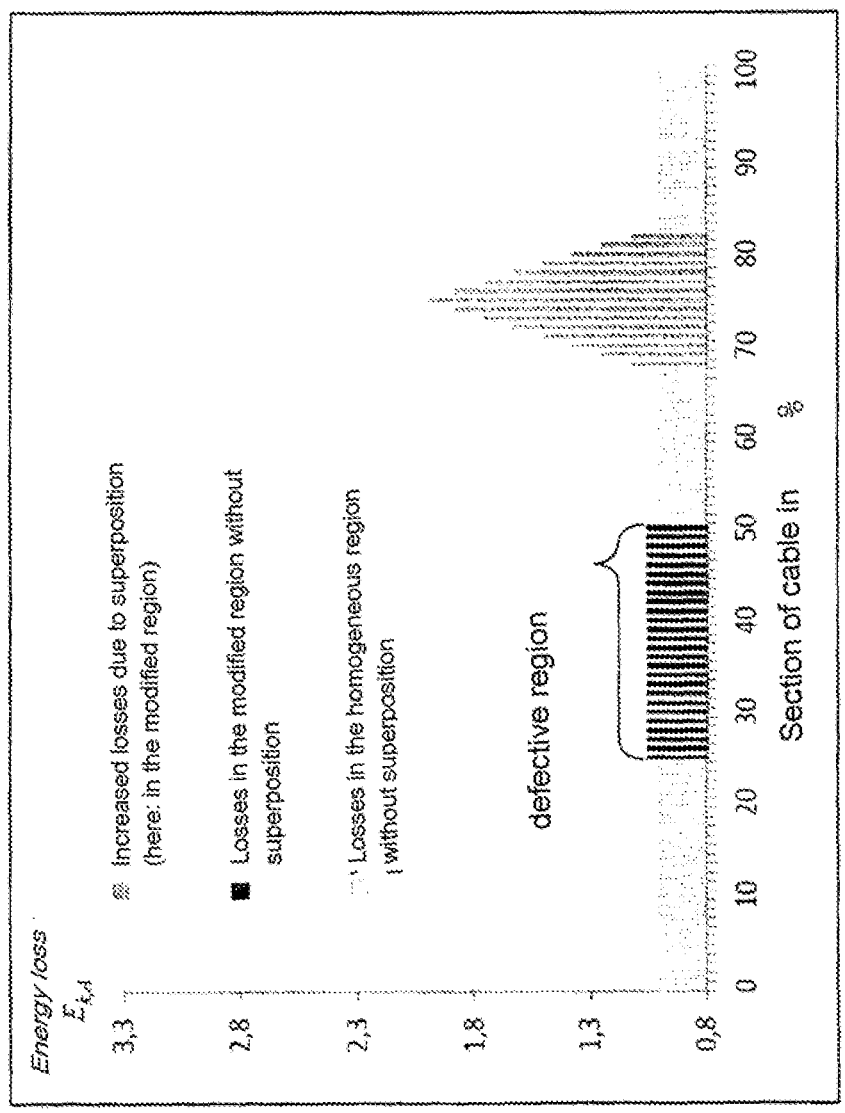
Figure 3:
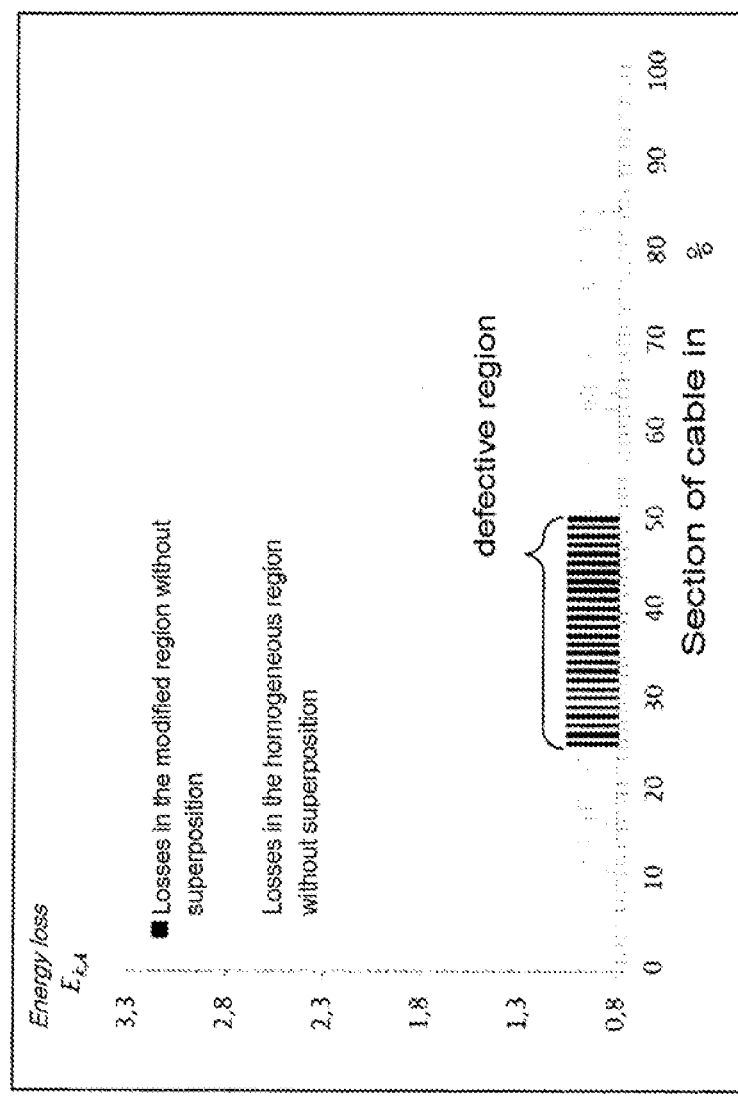
Figure 4:
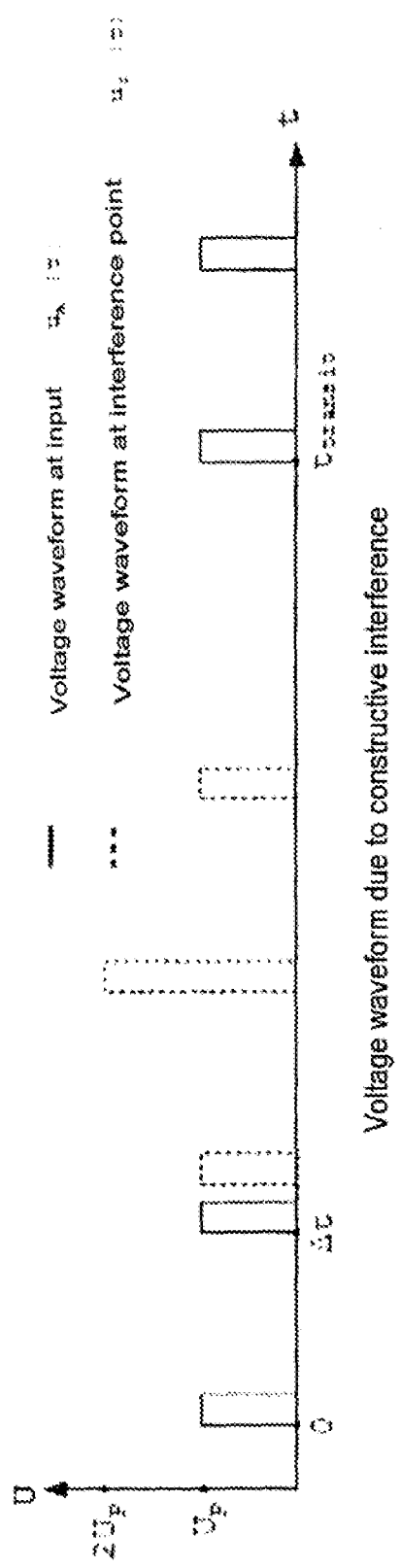
Figure 5:
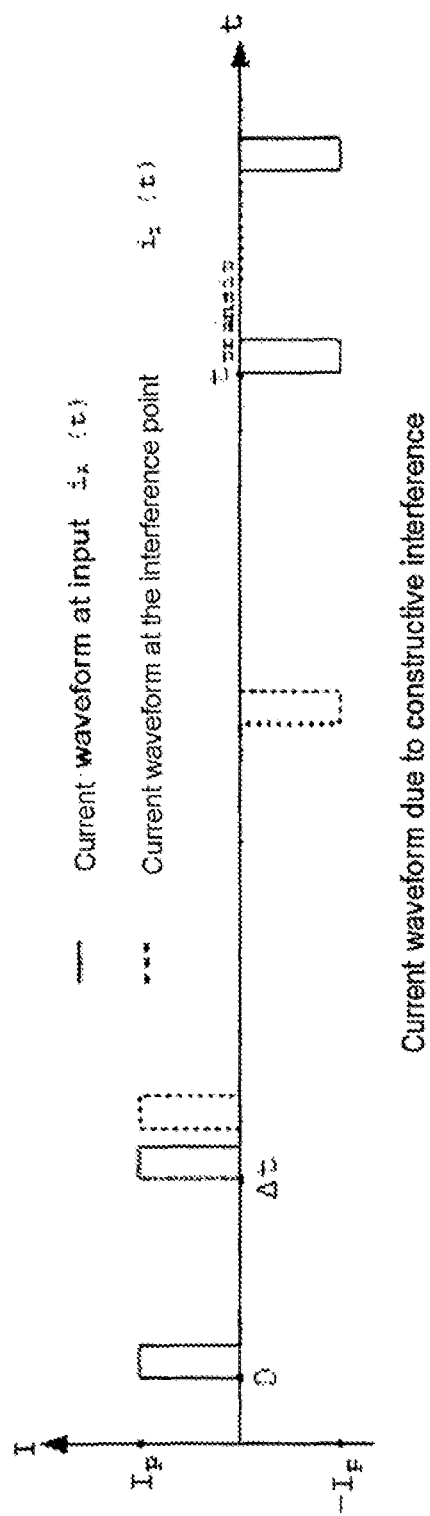

FIGS. 1 to 3 show different energy losses within a component to be diagnosed by the method, which shows modified dielectric properties in one region.

In the diagram of FIG. 1 the pulses meet exactly in this modified region, where they cause markedly increased losses. In FIG. 2 superposition of the pulses takes place in the unchanged (intact) region of the cable and in FIG. 3 the size of the pulse interval is selected such that no superposition takes place, so that the pulses no longer meet or interact with each other at all, and consequently no interference occurs either.

Considering further the ideal, unattenuated case, these energy waveforms with the voltage waveforms and/or current waveforms at the input and at the interference point in the cable, as shown in FIGS. 4 to 7, can be explained.

At the meeting point of the two pulses fed into the component, or at the interference point of the pulses—as indicated with a dashed line—either a voltage doubling or a complete cancellation of the current occurs. This voltage doubling acts for longest at the point of impact of the impulses and also therefore produces the largest dielectric losses there. These locally generated losses represent the diagnostic basis of the method according to the invention. From these, at each point x of the component under test the relevant characteristic parameters of the dielectric can be precisely determined and evaluated.

In order to determine the dielectric properties as a function of location, the medium under test must be scanned over its total length l using the method according to the invention. This is effected by varying the pulse interval Δt of the two pulses, or pulse pair, that are fed in.

First of all the total transit time tTransit or tSweep (tDurchlauf) of the pulses through the component must be determined, each of which is dependent on the propagation velocity and length of the component. This can be obtained, for example, by reflection measurement in the time domain or the frequency domain, i.e., by means of a conventional TDR measurement or FDR measurement. Regardless of the measurement method used to determine all relevant electrical conduction parameters, the smallest pulse interval ΔtMin is always dependent on the pulse width tW and must always be greater than or equal to the pulse width tW. The number of temporally resolvable steps between ΔtMin and ΔtMax yields the minimum step size (resolution) of the scanning in the axial direction of the component. The pulse width tW, furthermore, can be used to control the actual width of the interference zone of the two pulses, the propagation velocity and the overlap time of the pulses.

The pulse interval Δt due to interference at a point x under test, for an overall length l of the cable and a propagation velocity v of the pulses, can in general be calculated as follows:

$$\Delta t = t_s - t_z = \frac{2l - x}{v} \quad (9)$$

Therefore the largest possible pulse interval ΔtMax is given as follows:

$$v = \frac{2l}{t_{Transit}} \Rightarrow \Delta t_{Max} = \frac{2l}{v} \quad (10)$$

The result obtained is a positional plot of the locally produced electrical losses as a function of the measurement parameters, which forms the diagnostic basis for an estimation of the individual segments by means of the method according to the invention. There exists a plurality of possible approaches to the analysis of the measurement results, for example the estimation of the location-dependent condition from the energy loss at the respective point.

For example, by inducing respectively constructive and destructive interference at a specific point x of the component to be diagnosed the accuracy of the analysis of the local parameters, or criteria, can be considerably increased by suitable algorithms, where two options are available:

constructive interference (cf. in particular. FIG. 4, 5) can be produced for example by pulse pairs with equal voltage polarity, equal pulse width Δt and a defined interval tW, by which means an excess voltage occurs at a point of the component to be tested and locally increased dielectric losses are therefore induced.

Figure 6:
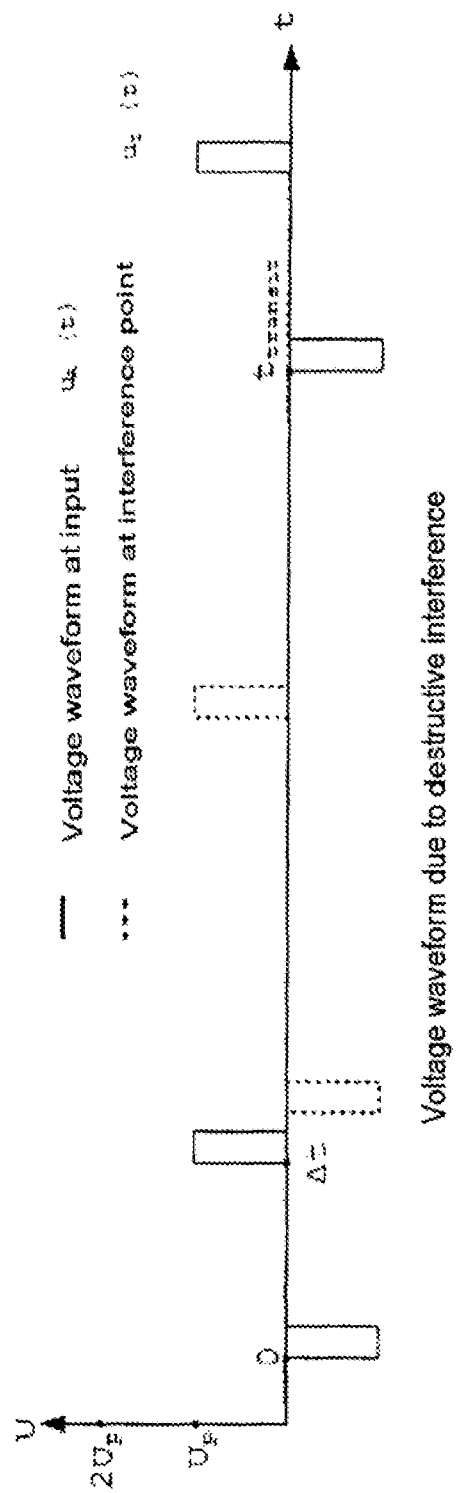
Figure 7:
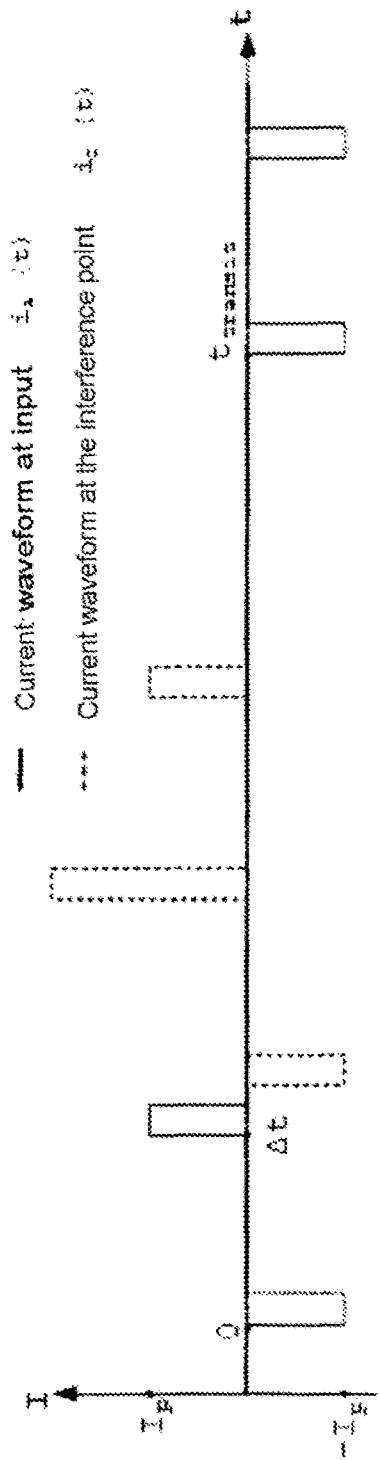

Destructive interference (cf. esp. FIG. 6, 7) on the other hand can be produced for example by pulse pairs each with equal pulse width tW and defined pulse interval Δt, but with each having different voltage polarity, by which means a voltage reduction occurs at a point of the component to be tested, and reduced dielectric losses occur as a result.

Detection and localization of gross impedance changes and reflection points in the component can be effected by modified TDR or FDR (e.g. Gaussian pulse reversal, cross correlation, resonance frequencies, frequency spectrum). A non-interaction of pulses can be applied as an additional comparison criterion, wherein the size of the pulse interval is selected such that no interference occurs in the component (cf. FIG. 3).

In addition, a baseline simulation (a counter simulation) can be carried out with an intact, comparable (reference) component as a comparison criterion. The basis of the simulation is formed by an equivalent circuit diagram for frequency-dependent, spatially extended electrical components, discretized into n (individual) elements.

In addition, as part of a better optimized mathematical analysis, a combination of different criteria, such as the energy loss for the case of constructive, destructive interference and/or no interference, and for a homogeneous and/or inhomogeneous component, spatially extended in its longitudinal direction, more rigorous mathematical criteria and correlations can be derived from these.

Finally, a calculation of the local energy losses, local parameters and local criteria can be obtained from the time waveform of the measured voltage or current (methods and approaches for calculation, special integration methods, Fourier transformation, etc.).

One possible method will be explained in more detail in the next section of the description:

first of all the voltage waveform at the input (cf. FIG. 9) is split into two components: one of these is the voltage waveform without its reflections and the other one is just the voltage waveform with the reflections inside the component. A voltage waveform Ue(t) and a voltage waveform Ur(t) are therefore obtained.

In the next method step, the "ACF" (ACF=autocorrelation function) of both functions is formed in a known manner. All resulting ordinate values that are below a defined threshold value, i.e., a certain percentage of the original amplitude, are then set to zero to compensate for the offset caused by the signal generator and filter system. The electrical energy loss is then calculated as follows:

$$E_V = \int AKF(u_e(t))dt = \int AKF(u_r(t))dt \quad (11)$$

According to this algorithm, the energy loss for the case of no interference in the component is calculated once for each interference point (constructive and/or destructive interference). Therefore the energy is then obtained as a local parameter in the case of constructive interference with two positive pulses in each case according to the relation $$E_{W+}(x) = E_{V+}(x) - E_{VN} \quad (12)$$

and in the case of destructive interference with alternating negative and positive pulses the energy is given according to the equation:

$$E_{W-}(x) = E_{VN} - E_{V-}(x) \quad (13)$$

In addition a comparison simulation with a homogeneous, i.e., an intact cable, is carried out and the energy loss calculated for this case. If we now relate the local parameter of the homogeneous conductor to that of the inhomogeneous conductor as a ration, we obtain as a local criterion eW(x).

Figure 8:
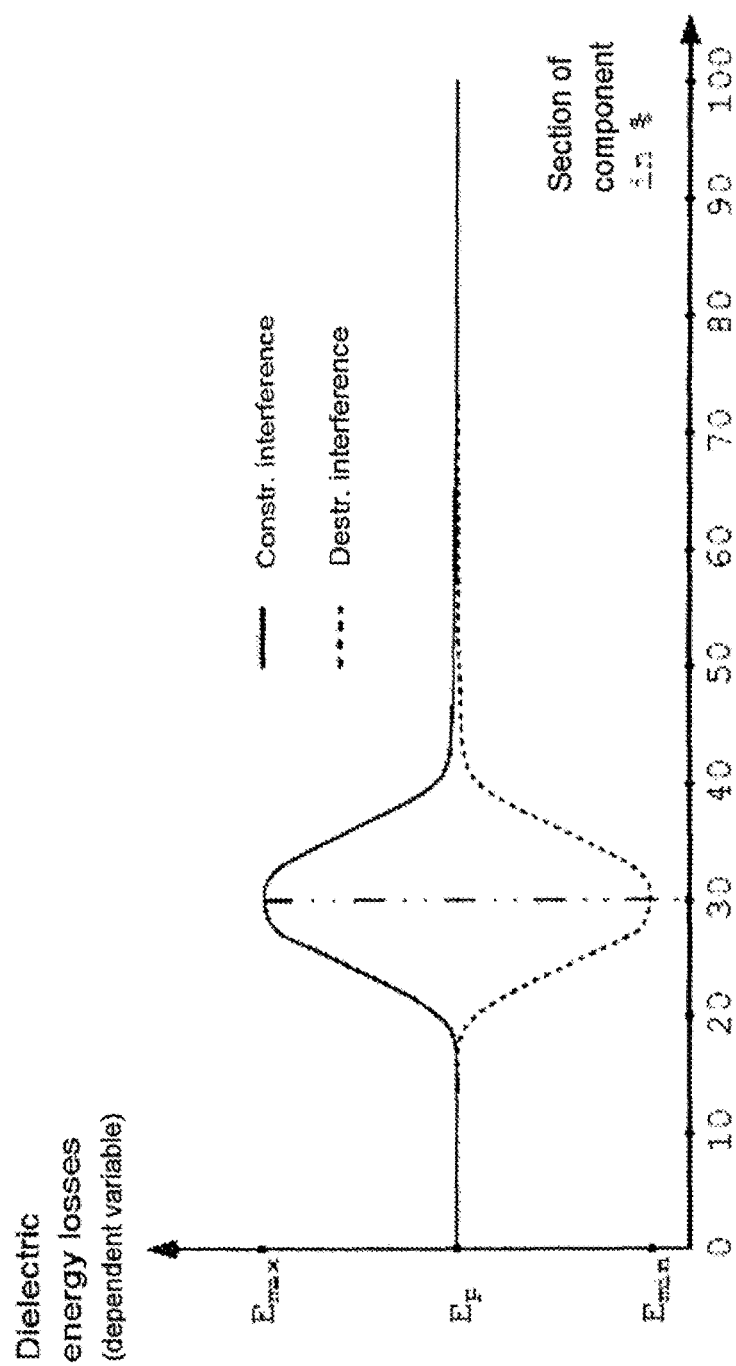

The diagram in FIG. 8 shows the dielectric energy losses over the section of a component under test, in particular a power transmission cable, plotted in %.

At approximately 30% (x=0.3, if overall length l is set=1.0) in relation to its (overall) length l the component has a defective region with significantly degraded dielectric characteristics. As an exemplary evaluation criterion for locating the defect site, the dielectric energy loss (related variable) is applied both in the case of constructive and destructive interference of the pulses.

Figure 9:
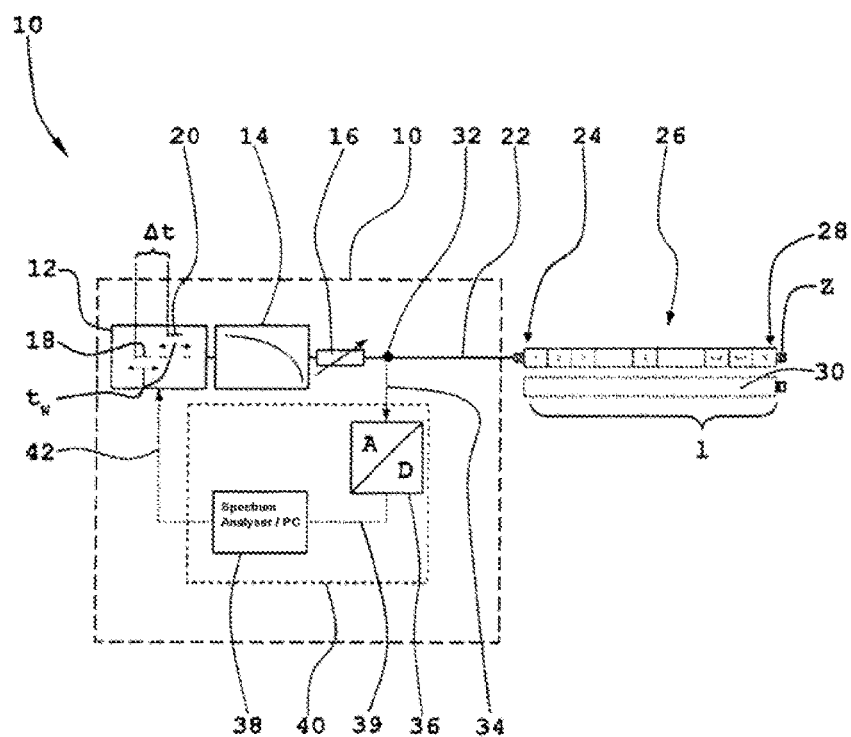

FIG. 9 shows a schematic view of an apparatus for implementing the method of spatially resolved diagnosis according to the invention on an extended component, in particular a cable for transmitting high electrical power.

The apparatus 10 comprises among other items a pulse generator or signal generator 12, downstream of which are a filter system 14 for band-limiting the input signal, and a variable impedance 16 for matching it to different types of component 26 or cables. Using the pulse generator or signal generator 12, by way of an example two identical pulses 18, 20, for example rectangularly shaped, with a variable pulse interval are generated and fed into a beginning 24 of a component 26 to be diagnosed via the filter system 14 and the impedance 16 via a coupling conductor 22. In principle the pulses 18, 20 can have any voltage or current waveform over time t. In each case two pulses 18, 20 are also designated as a pulse pair in the context of this description. The spatially extended component 26, which is preferably a multi-core high voltage cable with 3 phases, but with at least one core for transmitting electrical power or the like, comprises in this example a plurality of 1 . . . N regions or cable segments or cable sections and has an overall length l. At one end 28, an impedance Z is provided, which can be implemented as an open end, a short circuit or an active termination. In addition, a preferably virtual, digitally simulated or a real model 30 of the component 26, as indicated with a dotted line, can be connected to the coupling conductor 22. At a branching point 32, which can be for example a coupling element or a coupler, a measurement device 36, in particular an analogue-digital converter with a high sampling rate is connected via a (measurement) conductor 34, said converter being connected to a fast, preferably digital calculation unit 38, for example a PC, a digital oscilloscope, a spectrum analyzer, or a logic array. The digital values output by the analogue-digital converter of the analogue voltages on the measurement conductor 34 arrive at the calculation unit 38 for analysis via data conductors 39 (bus). The measurement device 36 together with the calculation unit 38 here forms an analysis unit 40.

The analysis unit 40 can also comprise input and output devices not shown here, such as for example screens, projectors, keyboards, acoustic signal transducers, printers, etc.

By means of an additional conductor 42, the pulse generator is preferably driven or triggered based on the results of the signal processing within the calculation unit 38. The pulse width tW, or the temporal length of the pulses 18, 20 is likewise variable, wherein this is preferably constant in each case.

The analysis unit 40 enables the voltage waveform at the beginning 24 of the component, which is implemented in the manner of a cable 26, to be measured and analyzed. At the same time the pulse interval Δt is varied preferably according to the results of the analysis, so that all segments 1 . . . N of the component 26 can be subjected to a high-precision, spatially resolved dielectric diagnosis. This allows any defective regions 1 . . . N to be reliably detected and where appropriate, their remaining service life to be predicted, so that an immediate replacement of the cable segment concerned can be planned.

Alternatively, the pulses can also be fed in at the beginning 24 or the end 28 of the component 26. Furthermore, the pulses 18, 20 can have a waveform deviating from the rectangular shape, shown in FIG. 9 merely as an example, and for example may have a triangular, sawtooth, trapezoidal, sinusoidal, exponential, bell-shaped (i.e. Gaussian) waveform or a combination of at least two of the geometries given.

Figure 10:
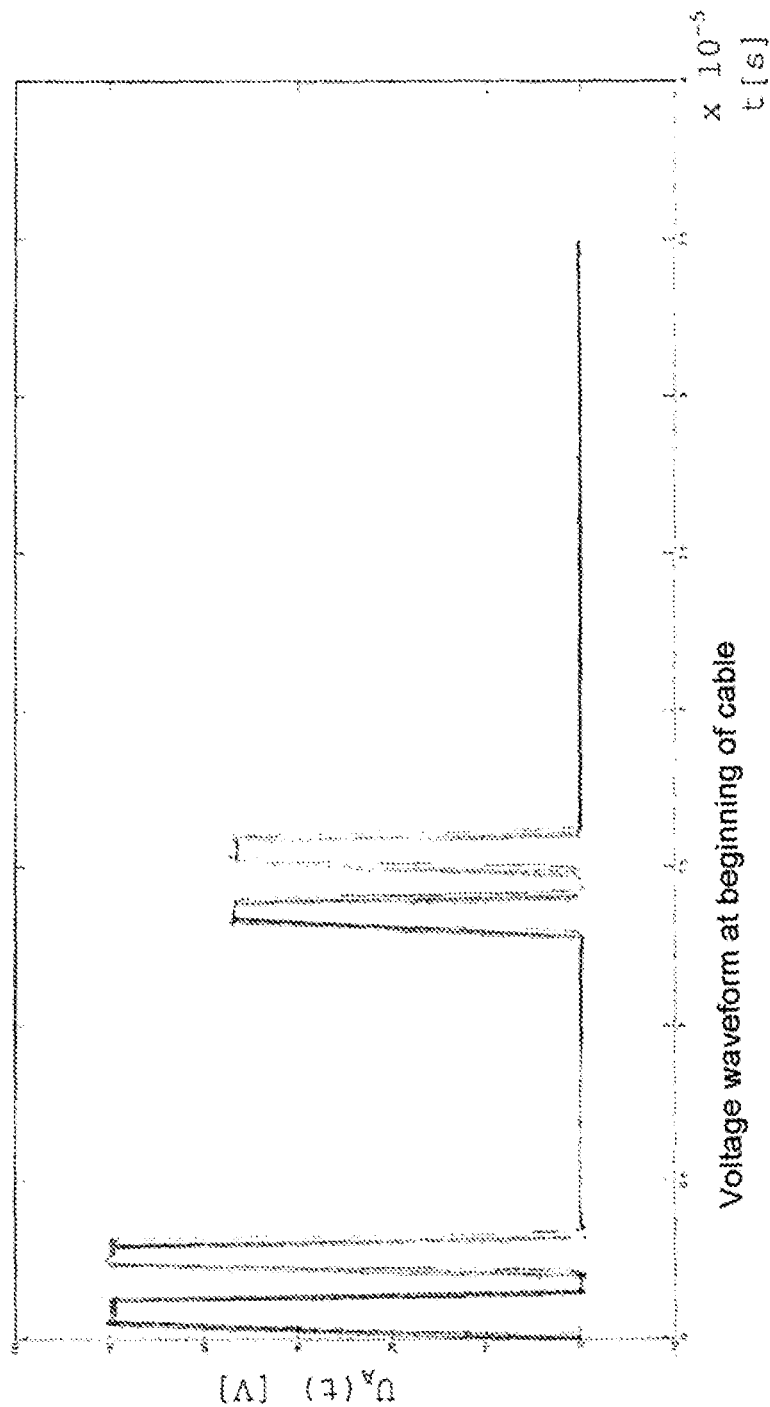
Figure 11:
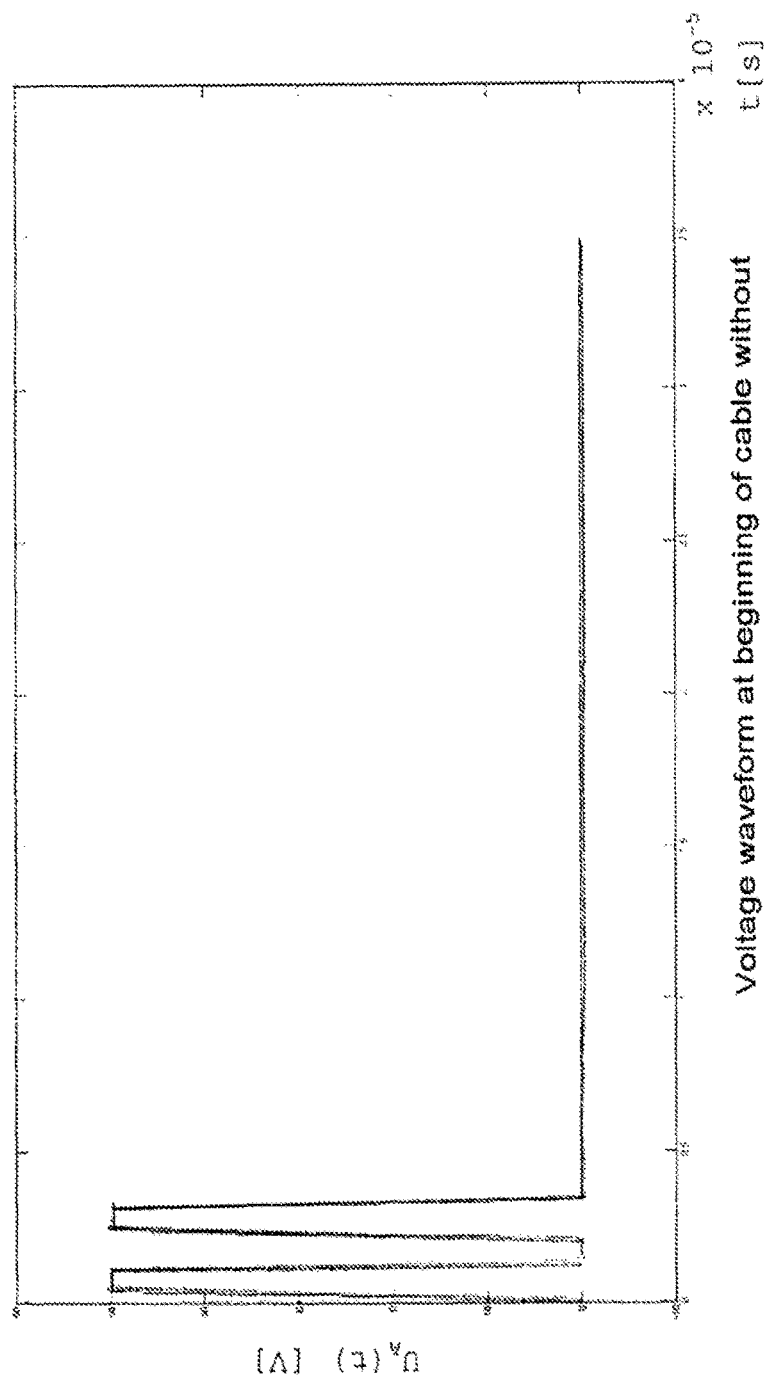
Figure 12:
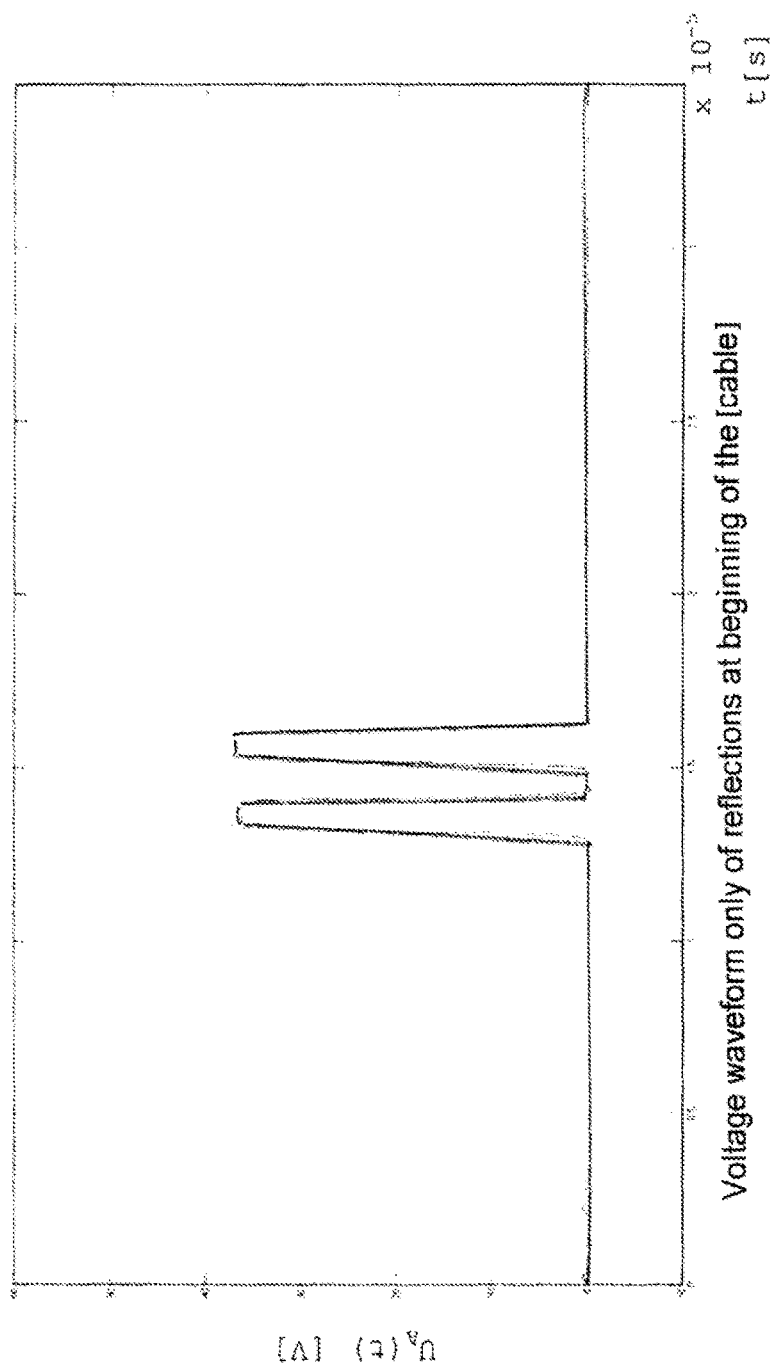

FIG. 10 shows the voltage waveform UA(t) occurring within the (measurement) device according to the invention of FIG. 9 at the beginning 24 of the component 26, which represents a superposition of FIG. 11 with the voltage waveform UA(t) at the beginning 24 of the component 26 without reflections and of FIG. 12 with the voltage waveform UA(t) at the beginning 24 of the component 26 containing the reflections alone.

The invention introduces for the first time the possibility of assessing the condition of individual segments or sections of a component under test, in particular a high voltage cable for electrical power transmission, and selectively replacing them in the event of failure, or of being able to predict their failure. For energy providers, for example, this therefore offers completely new possibilities in preventative cable diagnosis and asset management. By applying appropriate condition-based and risk-based strategies this represents a considerable savings potential in the maintenance and repair of cable harnesses. Furthermore, using the method according to the invention allows heterogeneous cable harnesses, for example mixed sections formed of cables with paper pulp and VPE insulation, to be examined and diagnosed using precise measurement techniques. Their construction and the positions of the cable couplers can be determined with high accuracy.

Furthermore, this is a non-destructive and low-load measurement method by means of which a deterioration in the electrical condition of the cable due to high voltage or current loads is substantially avoided during the measurement.

Diagnosis of the electrical condition is possible as a function of the position x along the longitudinal extension of the component (so-called spatial resolution). By this method individual cable segments or cable sections can be accurately assessed with respect to their dielectric properties to within one meter. The apparatus also permits among other things a measurement at the end of the component, so that no synchronization between the beginning and the end of the component is necessary. Rather, all that is necessary is a synchronization between the pulse generator or signal generator and the measurement signal detection.

The hardware for signal generation, measurement and control has a compact construction and, in contrast to conventional measurement methods and measurement equipment, enables problem-free use on site in the field, which represents a clear advantage vis-à-vis the prior art.

Ultimately, a combination of the method according to the invention with other diagnosis methods makes it possible to determine with high precision all relevant conductor parameters of a component in every differential sub-segment, or every section as appropriate.

As is apparent from the foregoing specification, the invention is susceptible of being embodied with various alterations and modifications which may differ particularly from those that have been described in the preceding specification and description. It should be understood that I wish to embody within the scope of the patent warranted hereon all such modifications as reasonably and properly come within the scope of my contribution to the art.

LIST OF REFERENCE NUMERALS

| | |
|---|---|
| 10. | Apparatus |
| 12. | signal/pulse generator |
| 14. | filter system |
| 16. | variable impedance |
| 18. | Pulse |
| 20. | Pulse |
| 22. | coupling conductor |
| 24. | beginning (component) |
| 26. | hardware component (cable) |
| 28. | end (component) |
| 30. | simulation (conductor) |
| 32. | branching point |
| 34. | conductor (measurement conductor) |
| 36. | measurement device |
| | computation unit |
| | data conductors (bus) |

-continued

| | |
|---|---|
| 40. | analysis unit |
| 42. | Conductor (trigger conductor) |
| 44. | pulse width (tW) |
| 46. | pulse width (tW) |
| Z | impedance |
| Δt | pulse interval |
| tW | pulse width |

The invention claimed is:

1. A method for diagnosing the electrical condition of a spatially extended hardware component in a spatially resolved manner by means of interference between pulses fed in into the component by a signal generator, comprising the steps:
 a) feeding at least a first pulse and a second pulse into a beginning of the component, wherein the first pulse and the second pulse are offset by a pulse interval, which is shorter or equal to the transit time of the double component length,
 b) detecting an interference of the second pulse with an echo of the first pulse by means of an analysis unit,
 c) varying the pulse interval, and thus an interference point, for the spatially resolved scanning of the component along its length,
 d) repeating the steps a) to c) by a variation of the pulse interval, and thus shifting the interference point, until the component has been scanned at least in some sections, and
 e) analyzing the detected interferences in the analysis unit.

2. The method according to claim 1, wherein in step e), to provide a spatially resolved diagnosis, local energy losses are mathematically determined along the length of the component on a basis of a plurality of interference voltage waveforms produced by the pulses and voltage waveforms, wherein the voltage waveforms are digitalized via the analysis unit and mathematically correlated with an error-free simulation of the component.

3. The method according to claim 1, wherein in each case two pulses of the same or opposite polarity constructively or destructively interfere with each other.

4. The method according to claim 1, wherein pulses and pulse sequences with a maximum amplitude of 1,000 volts are generated.

5. The method according to claim 1, wherein the length of the component is identified by means of the analysis unit and the signal generator, by means of a transit time measurement of at least one pulse.

6. The method according to claim 1, wherein the spatially resolved diagnosis of the electric condition of the component is carried out fully automatically, under control of the analysis unit.

7. The method according to claim 1, wherein the spatially resolved diagnosis of the electrical condition of the component is carried out manually.

8. The method according to claim 1, wherein the component comprises a cable for transmitting electrical power.

9. An apparatus for diagnosing an electrical condition of a spatially extended component in a spatially resolved manner by means of interference, wherein the apparatus comprises at least one signal generator and an analysis unit to be connected to the component, wherein the signal generator is to generate at least a first pulse and a second pulse which are offset by a pulse interval, and repeated first and second pulses which are offset by different pulse intervals, realizing an interference of the second pulse with an echo of the first pulse at a different interference point, and to feed the pulses into the component, and
 wherein the analysis unit is configured to provide a spatially resolved diagnosis over the length of the component by determining local energy losses on the basis of voltage waveforms induced by interferences of the second pulse with an echo of the first pulse.

10. The apparatus according to claim 9, wherein the voltage waveforms are digitalized by means of the analysis unit and are mathematically correlated with an error-free simulation of the component.

11. The apparatus according to claim 9, wherein a filter system and a variable impedance are connected downstream of the signal generator, wherein the variable impedance is connected to a beginning of the component.

12. The apparatus according to claim 9, wherein the analysis unit comprises a measurement device.

13. The apparatus according to claim 12, wherein the analysis unit comprises an analogue-digital converter and at least one digital calculation unit.

14. The apparatus according to claim 9, wherein one end of the component is open or terminated with an impedance Z.

15. The apparatus according to claim 10, wherein the error-free simulation of the component can be coupled to the signal generator and the analysis unit.

16. The apparatus according to claim 9, wherein pulses of the same polarity or pulses of opposite polarity can be generated by means of the signal generator.

17. The apparatus according to claim 9, wherein a length of the component is identified via the analysis unit and the signal generator.

18. The apparatus according to claim 17, wherein the length of the component is identified using a transit time measurement with at least one pulse.

19. The apparatus according to claim 9, wherein the component comprises a cable for transmitting electrical power.

* * * * *